US009276298B2

(12) United States Patent
Brown et al.

(10) Patent No.: US 9,276,298 B2
(45) Date of Patent: Mar. 1, 2016

(54) AUTOMATICALLY DETERMINING ALARM THRESHOLD SETTINGS FOR MONITORED BATTERY SYSTEM COMPONENTS IN BATTERY SYSTEMS, AND RELATED COMPONENTS, SYSTEMS, AND METHODS

(71) Applicants: David Brown, Raleigh, NC (US); David Robert Battle, Durham, NC (US); Christopher James Belcher, Cary, NC (US); Duncan Joseph Brown, Boulder, CO (US); George Feller, Carrboro, NC (US)

(72) Inventors: David Brown, Raleigh, NC (US); David Robert Battle, Durham, NC (US); Christopher James Belcher, Cary, NC (US); Duncan Joseph Brown, Boulder, CO (US); George Feller, Carrboro, NC (US)

(73) Assignee: NDSL, Inc., Raleigh, NC (US)

( * ) Notice: Subject to any disclaimer, the term of this patent is extended or adjusted under 35 U.S.C. 154(b) by 348 days.

(21) Appl. No.: 13/780,795

(22) Filed: Feb. 28, 2013

(65) Prior Publication Data
US 2014/0242432 A1 Aug. 28, 2014

(51) Int. Cl.
*H01M 10/63* (2014.01)
*H01M 10/48* (2006.01)
*H01M 10/42* (2006.01)
*G01R 31/36* (2006.01)
*G01R 19/165* (2006.01)

(52) U.S. Cl.
CPC ......... *H01M 10/482* (2013.01); *G01R 31/3693* (2013.01); *G01R 19/16542* (2013.01); *G01R 31/3631* (2013.01); *G01R 31/3658* (2013.01); *G01R 31/3662* (2013.01); *G01R 31/3679* (2013.01); *H01M 2010/4278* (2013.01)

(58) Field of Classification Search
CPC ..................................................... H01M 10/63
See application file for complete search history.

(56) References Cited

U.S. PATENT DOCUMENTS

| 4,086,392 A | 4/1978 | Mao et al. |
| 4,707,795 A | 11/1987 | Alber et al. |

(Continued)

FOREIGN PATENT DOCUMENTS

| WO | 9815821 A1 | 4/1998 |
| WO | 2011115640 A1 | 9/2011 |

OTHER PUBLICATIONS

Non-Final Office Action for US Appl. No. 13/461,862, mailed Apr. 28, 2015, 25 pages.

(Continued)

*Primary Examiner* — Jacob Marks
(74) *Attorney, Agent, or Firm* — Withrow & Terranova, PLLC

(57) ABSTRACT

Embodiments disclosed include automatically determining alarm threshold settings for monitored battery cells in battery systems. Battery monitoring control units are provided that are configured to initiate battery performance tests (e.g., ohmic tests) on battery cells in a battery system. Failing battery cells are identified as those battery cells having battery performance characteristics outside defined battery performance threshold settings. An initial performance alarm threshold setting is established for each battery cell because of unique performance characteristics that can substantially change during initial charging cycles before the battery cells have settled. A settled performance alarm threshold setting specific to each battery cell is then established based on battery cell performance during the defined settling time period. In this manner, more accurate performance alarm threshold settings are automatically established for monitoring each battery cell based on the individual performance characteristics of each battery cell during the settling time period.

45 Claims, 11 Drawing Sheets

(56) References Cited

U.S. PATENT DOCUMENTS

| | | | |
|---|---|---|---|
| 5,589,757 | A | 12/1996 | Klang |
| 6,094,030 | A | 7/2000 | Gunthorpe et al. |
| 7,811,701 | B2 | 10/2010 | Yao |
| 7,940,052 | B2 | 5/2011 | Vonderhaar et al. |
| 2006/0193095 | A1 | 8/2006 | Hunter et al. |
| 2006/0259280 | A1 | 11/2006 | Zaccaria |
| 2008/0290877 | A1 | 11/2008 | Oh et al. |
| 2010/0075207 | A1* | 3/2010 | Yen .................. G01R 31/3679 429/90 |
| 2010/0114512 | A1 | 5/2010 | Cotton et al. |
| 2010/0119955 | A1 | 5/2010 | Abe et al. |
| 2012/0025769 | A1 | 2/2012 | Kikuchi et al. |
| 2012/0068715 | A1 | 3/2012 | Martaeng |
| 2012/0116699 | A1 | 5/2012 | Haag et al. |
| 2012/0150464 | A1 | 6/2012 | Swanton |
| 2013/0041606 | A1 | 2/2013 | Tang et al. |

OTHER PUBLICATIONS

International Search Report and Written Opinion for PCT/US14/19360, mailed Jun. 20, 2014, 12 pages.

International Search Report and Written Opinion for PCT/US13/38975 mailed Oct. 1, 2013, 12 pages.

International Preliminary Report on Patentability for International Patent Application No. PCT/US13/38975 mailed Nov. 13, 2014, 11 pages.

International Preliminary Report on Patentability for International Patent Application No. PCT/US2014/019360, mailed Sep. 11, 2015, 11 pages.

Final Office Action for U.S. Appl. No. 13/461,862, mailed Nov. 9, 2015, 28 pages.

\* cited by examiner

AUTOMATICALLY DETERMINING ALARM THRESHOLD SETTINGS FOR MONITORED BATTERY SYSTEM COMPONENTS IN BATTERY SYSTEMS, AND RELATED COMPONENTS, SYSTEMS, AND METHODS

BACKGROUND

I. Field of the Disclosure

The technology of the disclosure relates generally to battery monitoring systems for battery power systems, such as uninterrupted power supplies (UPSs).

II. Background

An industrial system may rely on an uninterrupted power supply (UPS) to provide backup power in the event of a primary power system failure. The UPS may be provided in the form of a number of lead acid battery cells electrically connected in series. A battery charger is provided that keeps the battery cells charged in the event backup power is needed from the battery cells. However, each battery cell will eventually fail. For example, lead acid batteries may lose the ability to accept a charge when discharged over time due to sulfation. A battery containing one or more failed battery cells may be unable to power the industrial system at specified battery operating voltages, at specified battery operating currents, and/or for specified battery time durations.

Accordingly, an industrial system may employ a battery monitoring system to monitor the state-of-health (SOH) of battery cells in a backup power supply. The SOH of the battery cells can be used by service personnel to replace failing or underperforming battery cells to ensure the UPS function provided by the battery cells will deliver back-up power when needed. In this regard, the state-of-health (SOH) of a battery cell may be correlated with an ohmic value of the battery cell, such as an internal resistance, internal impedance, and/or internal conductance of the battery cell. For example, an increased internal resistance, increased internal impedance, and/or decreased internal conductance of a battery cell may be used to detect an impending failure or an actual failure of the battery cell. A battery cell which has been detected to have the impending failure or to have failed may be replaced.

In this regard, FIG. 1 illustrates a battery monitoring system 10. The battery monitoring system 10 comprises a battery monitoring control unit 12 and a battery monitoring device 14. The battery monitoring device 14 is configured to test performance values of a battery 16. The performance values may comprise ohmic values 17 of battery cells 18 of a backup power supply provided in the form of the battery 16. The battery 16 is comprised of a plurality of battery cells 18(1)-18(4) electrically connected in series. Each battery monitoring device 14 may be coupled to a subset 19 of battery cells 18 electrically connected in series and in a sequential order to form the battery 16. The subset 19 may comprise a battery cell substring with a unique set of battery cells 18 in the battery 16. The battery monitoring device 14 provides a pair of current-inducing leads L1, L2 configured to be coupled to the negative and positive terminals of a battery cell substring of the battery 16. The battery monitoring control unit 12 may instruct the battery monitoring device 14 to produce a current through the subset 19 of battery cells 18 (as a non-limiting example, battery cells 18(1)-18(4)) by activating a switch to place a resistive load in a current loop with the subset 19 of battery cells 18 (as a non-limiting example, battery cells 18(1)-18(4)) of the battery 16.

The battery monitoring device 14 further provides a plurality of voltage sensing leads V1-V5. The voltage sensing leads V1-V5 are configured to be coupled to measure a voltage across the negative and positive terminals of each battery cell 18(1)-18(4). As illustrated in FIG. 1, voltage leads V1-V5 have resistances $R_{V1}$-$R_{V5}$ and the pair of current-inducing leads L1-L2 have resistances $R_{L1}$-$R_{L2}$. To increase the accuracy of measured voltages, the battery monitoring device 14 may employ Kelvin sensing. In this regard, voltage sensing leads V1, V5 may optionally be provided separate from the current-inducing leads L1, L2 allowing the measured voltages to be more accurate than a system in which a single lead is used for both L1 and V1 and another single lead is used for both L2 and V5. This is because separating the current-inducing lead L1 from the voltage sensing lead V1 and separating the current-inducing lead L2 from the voltage sensing lead V5 significantly reduces the impedance contribution of the voltage sensing leads V1, V5. Because there is almost no current flow in the voltage sensing leads V1, V5, the voltage drop across the voltage sensing leads V1, V5 (i.e., across $R_{V1}$ and $R_{V5}$) is lower. As a result, using separate current-inducing leads L1, L2 and voltage sensing leads V1, V5 enables a more accurate measurement of the voltages across the battery cells 18(1)-18(4).

The battery monitoring device 14 may test an ohmic value 17 of a battery cell 18 by inducing a current through the subset 19 of battery cells 18 assigned to the battery monitoring device 14. The battery monitoring device 14 may induce the current at a predetermined frequency for a predetermined period of time. As a non-limiting example, the current may draw a predetermined amount of current from the subset 19 of battery cells 18. This may allow the battery monitoring device 14 to discriminate effects of the measurement from the noise generated by other loads pulling current from the battery 16 and/or generator(s) charging the battery cells 18 of the battery 16.

As discussed above, it is important to identify the battery cells 18(1)-18(4) in the battery monitoring system 10 that are either failing or underperforming. In this regard, the SOH information about each of the battery cells 18(1)-18(4) can be monitored through automated ohmic testing of the battery cells 18(1)-18(4). The battery monitoring control unit 12 can be configured to compare the ohmic test results of the battery cells 18(1)-18(4) to a predefined ohmic threshold. The battery cells 18(1)-18(4) identified as not meeting the predefined ohmic threshold can be designated as failing or underperforming. In response, the battery monitoring control unit 12 can be configured to generate alarms identifying the failing or underperforming battery cells 18(1)-18(4) so that technicians can be warned. The failing or underperforming battery cells 18(1)-18(4) can be replaced to ensure sufficient back-up power, when needed.

The predefined ohmic thresholds must be established for the battery monitoring control unit 12 to generate alarms. The predefined ohmic thresholds can be established through ohmic threshold settings. The ohmic threshold settings can be manually entered by a technician into the battery monitoring control unit 12 for each battery cell 18(1)-18(4). However, manual entry relies on human behavior. If a technician does not establish ohmic threshold settings, the battery monitoring control unit 12 may use the same, default ohmic threshold setting for each battery cell 18({1)-18(4). But, because different battery cells 18 can vary in their ohmic performance characteristics, a default ohmic threshold setting may not be accurate for each battery cell 18(1)-18(4). Also, other factors can affect the ohmic performance characteristics of a battery cell 18 that are not taken into consideration by a technician when providing ohmic threshold settings. For example, the connections (i.e., links) of battery cells 18(1)-18(4) is can also affect ohmic performance characteristics that may not be properly taken into account by a technician.

SUMMARY OF THE DISCLOSURE

Embodiments disclosed in the detailed description include automatically determining alarm threshold settings for monitored battery system components in battery systems, including battery cells, inter-cell links, intra-tier links and battery supply lines. Related components, battery monitoring systems, and methods are also disclosed. In embodiments disclosed herein, battery monitoring control units are provided that are configured to initiate battery performance tests (e.g., ohmic tests) on battery system components in a battery system. Failing or underperforming battery system components are identified as having battery performance characteristics outside defined battery performance threshold settings. One example of a battery performance characteristic is ohmic value. Battery system components have unique performance characteristics that can substantially change during initial charging cycles before the battery system components have settled. In this regard, an initial performance alarm threshold setting is established for each battery cell. The initial performance alarm threshold setting is used by the battery monitoring control units to detect failing battery system components until a defined settling time period has expired. After the defined settling time period has expired, a settled performance alarm threshold setting specific to each battery cell is established based on battery cell performance during the defined settling time period. The specified settled performance alarm threshold setting is then used to detect failing battery system components in place of the initial performance alarm threshold setting. In this manner, more accurate performance alarm threshold settings are automatically established for monitoring each battery system component based on individual performance characteristics and their variations over time.

In this regard, in one embodiment, a battery monitoring control unit is provided. The battery monitoring control unit is configured to automatically determine performance alarm threshold settings for battery system components. The battery monitoring control unit is configured to instruct at least one battery monitoring device coupled to a plurality of battery system components to measure a performance value of each tested battery system component. Before expiration of a defined battery settling time period, the battery monitoring control unit is further configured to set an initial performance alarm threshold value for each tested battery system component based on the measured performance value of the tested battery system component. The initial performance alarm threshold value is used by the battery monitoring control unit to determine battery performance characteristics of the tested battery system component during an initial battery testing time period. Upon expiration of the defined battery settling time period, the battery monitoring control unit is further configured to set a settled performance alarm threshold setting for each tested battery system component, based on a plurality of the measured performance values. The settled performance alarm threshold setting is used by the battery monitoring control unit to determine battery performance characteristics of each tested battery system component after the battery settling time period.

In another embodiment, a method of automatically determining performance alarm threshold settings for a plurality of battery system components monitored by a battery monitoring system is provided. The method comprises instructing at least one battery monitoring device coupled to a plurality of battery system components to measure a performance value of each battery system component of the plurality of battery system components. The method further comprises setting an initial performance alarm threshold value for each tested battery system component of the plurality of battery system components before expiration of a defined battery settling time period. The initial performance alarm threshold value is used by the battery monitoring control unit to determine battery performance characteristics of the tested battery system component during an initial battery testing time period. The method further comprises setting a settled performance alarm threshold setting for each tested battery system component upon expiration of the defined battery settling time period, based on a plurality of the measured performance values. The settled performance alarm threshold setting is used by the battery monitoring control unit to determine battery performance characteristics of each tested battery system component after the battery settling time period.

In another embodiment, a battery monitoring system is provided. The battery monitoring system comprises a plurality of battery cell sub-strings. Each of the battery cell sub-strings comprises a plurality of battery cells that are electrically connected in series. At least one inter-tier link electrically couples one battery cell substring to another battery cell substring of the plurality of battery cell substrings to form a battery. A plurality of inter-cell links electrically couple adjacent battery cells of the plurality of battery cells together to form a battery cell substring. Each battery monitoring device of the plurality of battery monitoring devices is coupled to a battery cell substring among the plurality of battery cell substrings. The battery monitoring control unit is coupled to the plurality of battery monitoring devices.

Also in this embodiment, the battery monitoring control unit is configured to automatically determine performance alarm threshold settings for battery system components. Before expiration of a defined battery settling time period, the battery monitoring control unit is configured to instruct at least one of the plurality of battery monitoring devices. The plurality of battery monitoring devices are coupled to a plurality of battery system components to measure an initial performance value of each battery system component. The battery monitoring control unit then sets an initial performance alarm threshold setting for each tested battery system component of the plurality of battery system components based on the at least one measured performance value of the tested battery system component. The initial performance alarm threshold setting is used by the battery monitoring control unit to determine battery performance characteristics of the tested battery system component during an initial battery testing time period. The battery monitoring control unit then instructs at least one of the plurality of battery monitoring devices coupled to a plurality of battery system components to measure at least one subsequent performance value of each battery system component of the plurality of battery system components. Upon expiration of the defined battery settling time period, the battery monitoring control unit sets a settled performance alarm threshold setting for each tested battery system component based on the at least one subsequent measured performance value of each tested battery system component. The settled performance alarm threshold setting is used by the battery monitoring control unit to determine battery performance characteristics of each tested battery system component after the defined battery settling time period.

DETAILED DESCRIPTION

Figure 1:
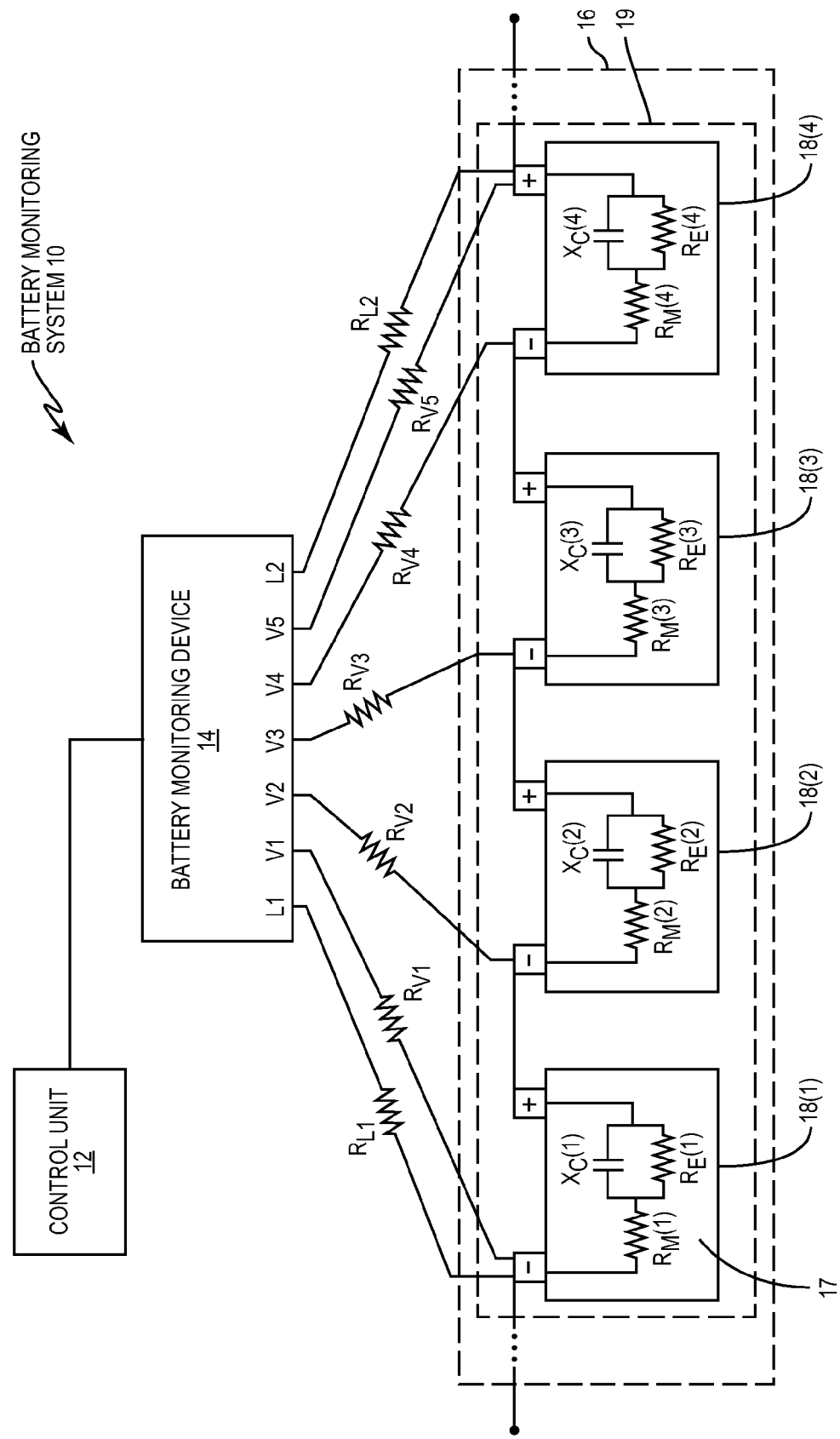
FIG. 1 is a block diagram of an exemplary battery monitoring system that includes battery cells electrically connected in series to form a backup power supply, a battery monitoring device, and a battery monitoring control unit for controlling the battery monitoring device.

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments disclosed in the detailed description include automatically determining alarm threshold settings for monitored battery system components in battery systems. Related components, battery monitoring systems, and methods are also disclosed. In embodiments disclosed herein, battery monitoring control units are provided that are configured to initiate battery performance tests (e.g., ohmic tests) on battery system components in a battery system. Failing or underperforming battery system components are identified as having battery performance characteristics outside defined battery performance threshold settings. One example of a battery performance characteristic is ohmic value. Battery system components have unique performance characteristics that can substantially change during initial charging cycles before the battery system components have settled. In this regard, an initial performance alarm threshold setting is established for each battery system component. The initial performance alarm threshold setting is used by the battery monitoring control units to detect failing battery system components until a defined settling time period has expired. After the defined settling time period has expired, a settled performance alarm threshold setting specific to each battery cell is established based on battery cell performance during the defined settling time period. The specified settled performance alarm threshold setting is then used to detect failing battery system components in place of the initial performance alarm threshold setting. In this manner, more accurate performance alarm threshold settings are automatically established for monitoring each battery system component based on individual performance characteristics and their variations over time.

Those of skill in the art will appreciate that various performance parameters may be measured including but not limited to ohmic, voltage and current values of the plurality of battery system components. Throughout the detailed description, a non-limiting example of ohmic value is used.

In this regard, automatically determining alarm threshold settings for monitored battery system components in uninterrupted power supply battery systems based on various performance parameters are disclosed. As will be discussed in more detail below, battery system components can include not only battery cells, but also battery cell connections components.

Figure 2:
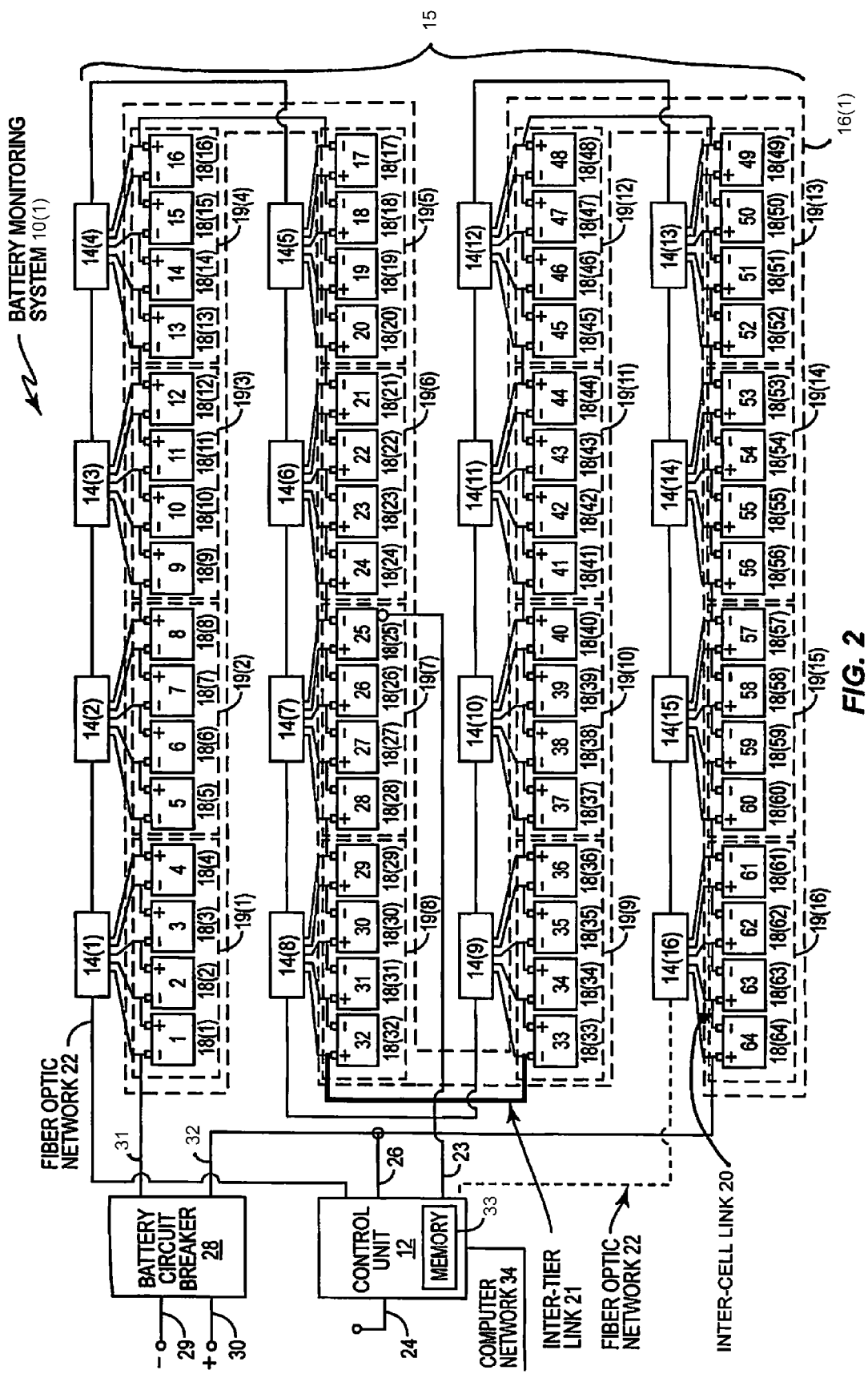
FIG. 2 is a block diagram of another exemplary battery monitoring system configured to test battery performance (e.g., ohmic) values of battery system components of a backup power supply which automatically sets ohmic alarm threshold values.

In this regard, referring now to FIG. 2, a battery monitoring system 10(1) used for monitoring a battery 16(1) representing a typical uninterrupted power supply (UPS) for an industrial system is provided. The battery 16(1) in this example includes a plurality of battery cells 18 (for example, more than the four battery cells 18(1)-18(4) depicted in FIG. 1). By having a plurality of battery cells 18, the battery 16(1) may provide an increased amount of power, an increased duration of power, an increased amount of voltage, and/or an increased amount of current.

In this regard, FIG. 2 illustrates an exemplary battery monitoring system 10(1) for monitoring a battery backup system comprising a plurality of battery cells 18 (as a non-limiting example, battery cells 18(1)-18(64)). The battery monitoring system 10(1) automatically determines alarm threshold settings for monitored battery system components 15 in uninterrupted power supply battery systems based on various performance parameters. The battery monitoring system 10(1) may comprise a plurality of battery monitoring devices 14 (as a non-limiting example, battery monitoring devices 14(1)-14(16)). Because there may be multiple battery monitoring devices 14, one or more battery monitoring control units 12 may be provided to control the battery monitoring devices 14.

With continuing reference to FIG. 2, each battery monitoring device 14 may monitor a battery system component 15 in the form of a battery cell subset 19 (as a non-limiting example, a battery cell substring) of the battery cells 18 of the battery 16(1). In this regard, the battery 16(1) comprises a plurality of battery cell subsets 19 of the battery cells 18. Each battery cell subset 19 of the battery cells 18 is assigned to be monitored by a different battery monitoring device 14. As illustrated in FIG. 2, each of the plurality of battery cell subsets 19 may be comprised of the plurality of battery cells 18 electrically connected in series. Each of the plurality of battery cells 18 are electrically connected in series by a battery system component 15 of inter-cell links 20, as a non-limiting example, between the positive terminal of battery cell 18(63) and negative terminal of battery cell 18(64).

With continuing reference to FIG. 2, each battery monitoring device 14 may monitor a battery cell subset 19 (as a non-limiting example, a battery cell substring) of the battery cells 18 of the battery 16(1). In this regard, the battery 16(1) comprises a plurality of battery cell subsets 19 of the battery cells 18. Each battery cell subset 19 of the battery cells 18 is assigned to be monitored by a different battery monitoring device 14. As illustrated in FIG. 2, each of the plurality of battery cell subsets 19 may be comprised of the plurality of battery cells 18 electrically connected in series. Each of the plurality of battery cell subsets 19 are electrically connected in series by battery system components 15 of inter-tier links 21, as a non-limiting example between the positive terminal of battery cell 18(32) and negative terminal of battery cell 18(33).

The battery monitoring system 10(1) is comprised of the plurality of battery monitoring devices 14(1)-14(16) that are each controlled by a battery monitoring control unit 12. The plurality of battery monitoring devices 14(1)-14(16) are coupled to a fiber optic network 22. The fiber optic network 22 is provided in lieu of an electricity-conducting network so that electricity stored in the battery cells 18 (as a non-limiting example, battery cells 18(1)-18(64)) is unable to conduct through the fiber optic network 22 connecting the plurality of battery monitoring devices 14(1)-14(16) and the battery monitoring control unit 12. As illustrated in FIG. 2, the fiber optic network 22 may form a fiber optic loop. In this regard, two interface ports of the battery monitoring control unit 12 may be coupled to the fiber optic network 22. In another embodiment, the fiber optic network 22 may not form a fiber optic loop. In this embodiment, the battery monitoring control unit 12 may have a single interface port connecting the battery monitoring control unit 12 to the plurality of battery monitoring devices 14(1)-14(16) to network the battery monitoring control unit 12 and the battery monitoring devices 14(1)-14(16) together.

With continued reference to FIG. 2, the battery monitoring control unit 12 may also comprise a battery cell temperature sensor(s) 23 and/or an ambient temperature sensor(s) 24. The battery cell temperature sensor(s) 23 may be coupled to at least one battery cell (as a non-limiting example, battery cell 18(8)) of the battery 16(1) for measuring one or more pilot temperatures of the battery 16(1). The battery monitoring control unit 12 may also comprise a current sensor(s) 26 for sensing current of the battery 16(1).

As illustrated in FIG. 2, the battery monitoring system 10(1) also comprises a battery circuit breaker 28 for protecting the battery 16(1) from overcurrents. The battery circuit breaker 28 provides a negative terminal 29 of the battery 16(1) and a positive terminal 30 of the battery 16(1) for external loading. In some embodiments, the battery monitoring system 10(1) comprises two or more of the battery circuit breakers 28. The two or more of the battery circuit breakers 28 protect different battery cell subsets 19 of battery cells 18 of the battery 16(1). As a non-limiting example, two battery circuit breakers 28 are provided. A first of the two battery circuit breakers is connected to the negative terminal 29 and a center terminal (as a non-limiting example, the positive terminal of battery cell 18(16)) of the battery 16(1). The second of the two battery circuit breakers 28 is connected to the center terminal and the positive terminal 30 of the battery 16(1). In this manner, a maximum current and/or maximum voltage experienced by a device and/or user shorting across the negative and positive terminals 29, 30 of one of the at least one battery circuit breakers 28 is limited. The battery 16(1) is coupled to the at least one battery circuit breaker 28 by battery supply lines. The battery supply lines are comprised of a first battery supply line 31 coupled to the negative terminal of one of a plurality of battery cells 18 and a second battery supply line 32 coupled to the positive terminal of one of a plurality of battery cells 18. The battery monitoring device 14 may also be configured to measure performance values of the battery supply lines coupled to the at least one battery circuit breakers 28.

With continued reference to FIG. 2, as discussed above, the battery monitoring device 14 is configured to measure and monitor battery system components 15 in the battery monitoring system 10(1). A battery system component 15 is a component that contributes to the energy storage and distribution of power from the battery cells 18(1)-18(64) in the battery monitoring system 10(1). For example, the battery system components 15 can include the battery cells 18(1)-18(64) themselves. Battery cells 18 have battery performance characteristics, such as ohmic value for example, that can be measured to determine performance. Other battery system components 15 that can also be measured and monitored in the battery monitoring system 10(1) include the inter-cell links 20 and the inter-tier links 21. Performance characteristics of inter-cell links 20 and the inter-tier links 21, such as their ohmic value, affect energy storage and power performance, and thus can also be used to determine the health and performance of the battery monitoring system 10(1). The embodiments disclosed herein can also measure performance characteristics of the inter-cell links 20 and the inter-tier links 21 individually, or in connection combination with battery cells 18(1)-18(64). For example, the measured and monitored battery system components 15 can include the battery cell subsets 19, which are comprised of battery cells 18 connected by inter-cell links 20. Further, the first battery supply line 31 and the second battery supply line 32 are other examples of battery system components 15 that can be measured and monitored. The performance values of the inter-cell links 20 and the inter-tier links 21 may also be separately measured and monitored from other battery system components 15, including the battery cells 18(1)-18(4).

With continuing reference to FIG. 2, it is important to identify battery system components 15 in the battery monitoring system 10(1), such as battery cells 18(1)-18(64) for example, that are either failing or underperforming. In this regard, the SOH information about each of the battery system components 15 can be monitored through automated ohmic testing of the battery system components 15. The battery monitoring control unit 12 can be configured to compare the ohmic test results of the battery system components 15 to a predefined ohmic threshold. The battery system components 15 identified as not meeting the predefined ohmic threshold can be designated as failing or underperforming. In response, the battery monitoring control unit 12 can be configured to automatically generate alarms identifying the failing or underperforming battery system components 15 so that technicians can be warned. The failing or underperforming battery system components 15 can be replaced to ensure sufficient back-up power, when needed.

In this regard, the battery monitoring control unit 12 in FIG. 2 can be configured to test the battery cells 18 (as a non-limiting example, battery cells 18(1)-18(64)) of the battery 16(1) in a predefined order as an example. In this example of a battery cells 18 being the battery system components 15 being tested, the battery monitoring control unit 12 first tests the battery cell 18(1). The battery monitoring control unit 12 then tests, as a non-limiting example in a predefined order, battery cells 18(2), 18(3), 18(4), 18(5), ... 18(63), and 18(64). Each battery cell 18 may be tested as follows, the battery monitoring control unit 12 instructs the battery monitoring device 14 assigned to the battery cell 18 to couple a current-inducing load to the battery cell subset 19 (as a non-limiting example, a battery cell substring) of the battery cells 18 monitored by the battery monitoring device 14. The battery monitoring control unit 12 instructs the battery monitoring device 14 assigned to the battery cell 18 to measure the voltage of the battery cell 18. The battery monitoring control unit 12 determines (or instructs the battery monitoring device 14 to determine) the performance value (e.g. ohmic) of the battery cell 18 based on the measured voltage. The battery monitoring device 14 decouples the current-inducing load from the battery cell subset 19 of the battery cells 18. The current-inducing load is decoupled to stop inducing the current through the battery cell subset 19 of the battery cells 18 monitored by the battery monitoring device 14. The measured performance values may be recorded in a memory 33 in the battery monitoring control unit 12. As an alternative embodiment the measured performance values may be stored in memory 33 accessible via a computer network 34.

Figure 3:
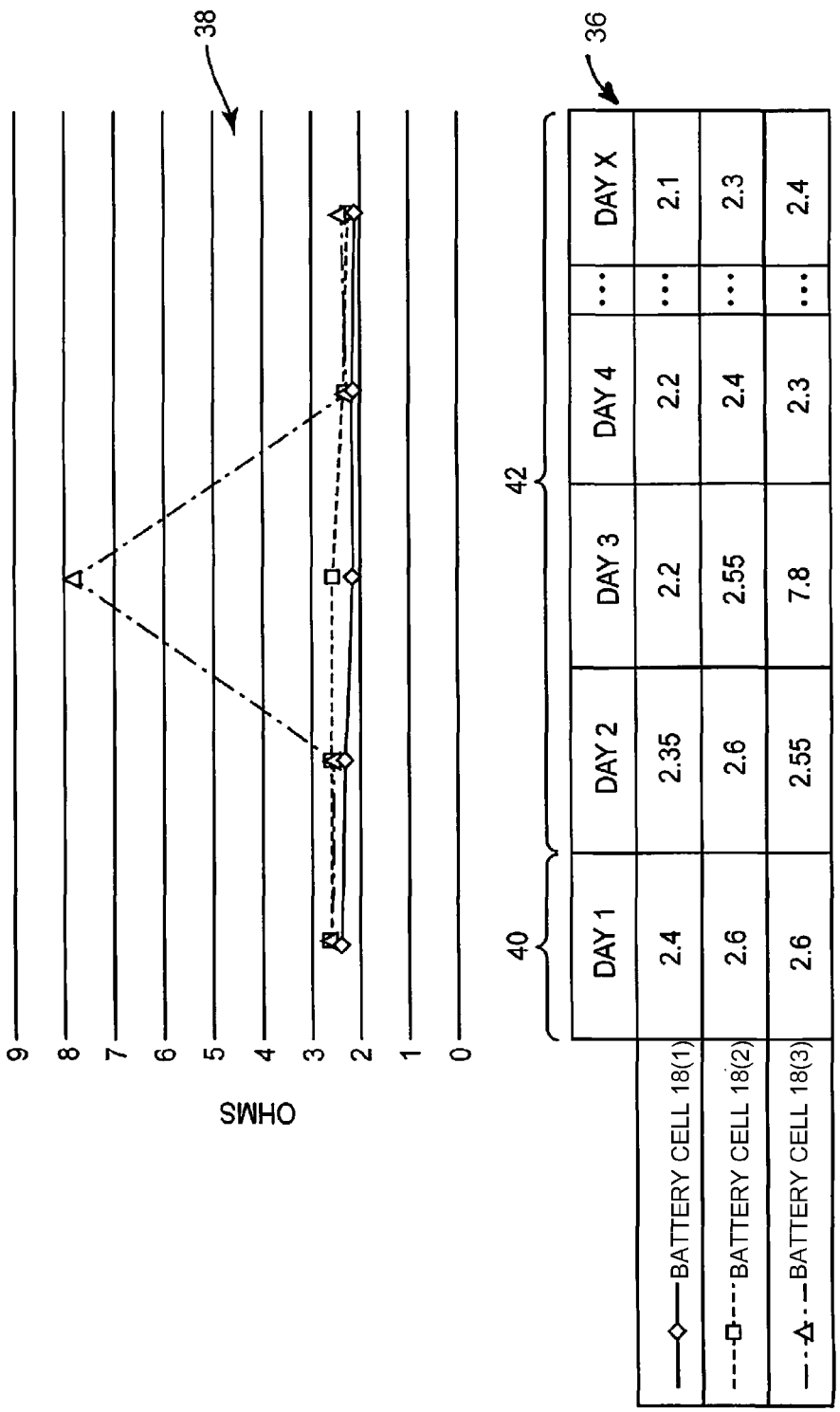
FIG. 3 is an exemplary chart illustrating a set of measured performance (e.g. ohmic) values of tested battery system components in a battery monitoring system during the defined battery settling time period of a backup power supply.

In this regard, FIG. 3 illustrates an exemplary embodiment of a measured performance (e.g. ohmic) value table 36 and a corresponding measured performance value graph 38 (e.g. ohmic) for the plurality of battery cells 18 as an example of battery system components 15. The measured ohmic value table 36 and the corresponding measured performance value graph 38 represent the values which may be recorded in memory 33 that have been measured by the battery monitoring device 14. As discussed above, measured performance characteristics may be ohmic values 17 of the battery cells 18. The measured performance characteristics may also include voltage, current, internal impedance and/or internal conductance, as non-limiting examples.

The performance characteristics of the battery cells 18 will change as the battery cells 18 settle over a period of time. The battery cells 18 will settle over a defined battery settling time period while the battery cells 18 operate in their normal charge or cyclically charged environment. The defined battery settling time period may be a default time period or determined by the system as appropriate for the battery cells 18 under test. In this regard, following initial installation, the battery cells 18 may require a settling period before a longer term performance baseline of the battery cells 18 may be determined. Upon initial installation of the plurality of battery cells 18 in the battery 16(1), the battery monitoring device 14 will initially test the plurality of battery cells 18. As a result of the initial test of the plurality of battery cells 18, the battery monitoring control unit 12 will store the initial measured performance values 40 in memory 33. As a non-limiting example, and as illustrated in the measured ohmic value table 36, this may represent the measurements made on Day 1.

With continued reference to FIG. 3, the battery monitoring control unit 12 of FIG. 2 will continue to instruct the battery monitoring device 14 to test each of the plurality of battery cells 18 subsequent to the initially recorded tests. In this manner, any anomalies in performance (e.g. ohmic) measurements may be detected. The subsequent tests of each of the plurality of battery cells 18 will measure at least one subsequent measured performance value 42 for each battery cell 18 of the plurality of battery cells 18. The subsequent measured performance value 42 may be tested and recorded on a periodic basis during the defined battery settling time period. Both a periodic interval and the defined battery settling time period may be variably set by the battery monitoring system 10(1). It should be noted that each of the plurality of battery cells 18 will have performance characteristics that are unique and distinct from each of the other battery cells 18 in the battery 16(1). For this reason each of the plurality of battery cells 18 will be tested and the corresponding measured performance values will be recorded. As a non-limiting example, the measured ohmic value table 36 illustrates that the initial measured performance values 40 may be higher than the subsequent measured performance values 42. During the defined battery settling time period, the subsequent measured performance values 42 will begin to stabilize.

It is possible that anomalies may occur during the defined battery settling time period in a subsequent measured performance value (e.g. ohmic). While the trend in this exemplary measured ohmic value table 36 is shown with the subsequent ohmic values generally lowering as subsequent measurements are measured, it is possible that performance values may not always follow this trend. Thus, anomalies may occur. As a non-limiting example, Day 3 for the battery cell 18(3), an anomaly has occurred indicating a likely problem. The battery monitoring control unit 12 may generate an alarm indicating that system operator intervention may be required. Upon expiration of the defined battery settling time period a longer term performance baseline of the battery cells 18 may be determined. As will be discussed below, the recorded subsequent measured performance values 42 may be averaged to ascertain a more stable performance measurement as appropriate. The embodiments discussed herein, will describe determining the performance values, setting performance alarm thresholds, and generating alarms based on current measurements as compared to the performance alarm thresholds signifying a failing or underperforming battery cell 18.

Figure 4:
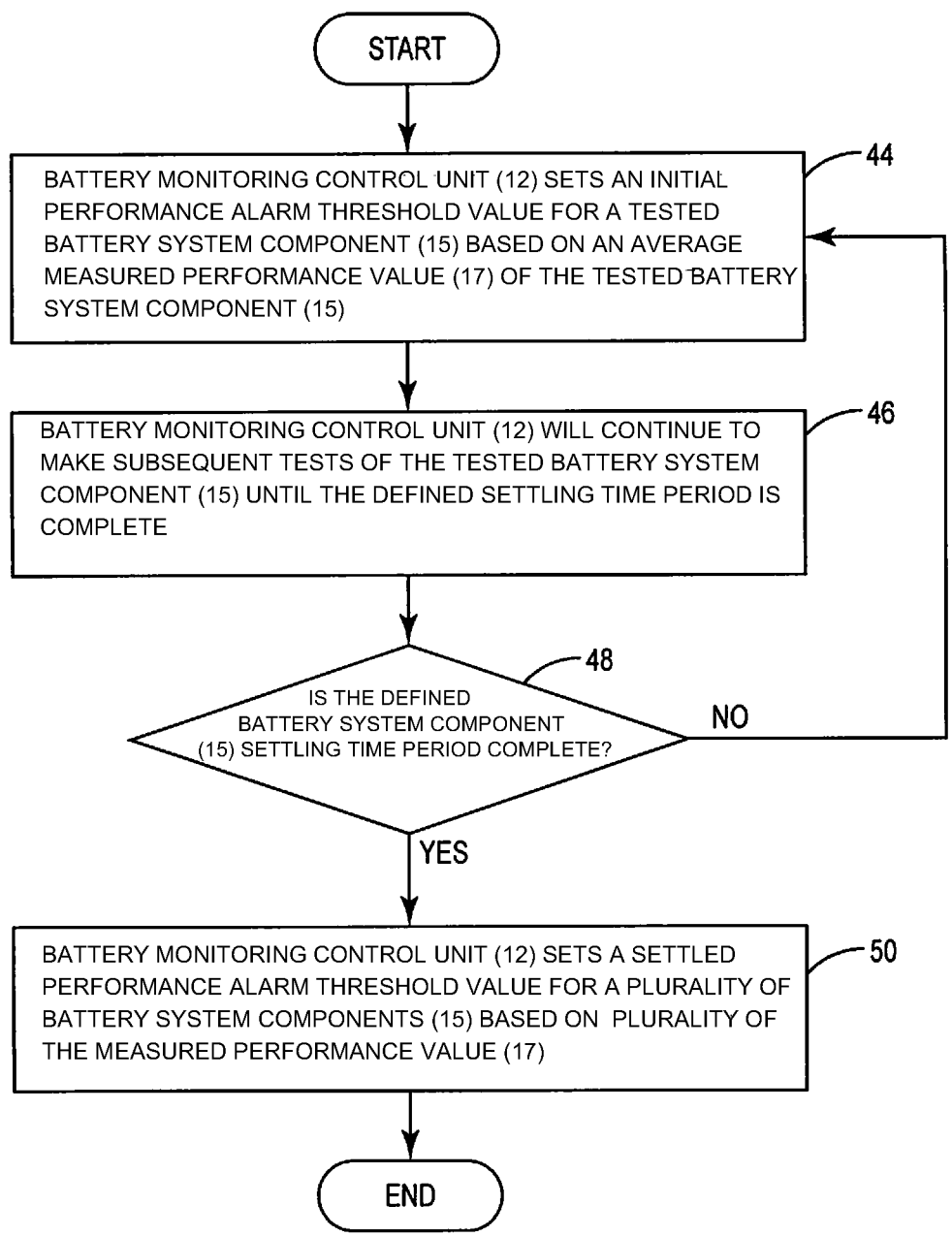
FIG. 4 is a flowchart illustrating an exemplary performance alarm threshold setup process, wherein the performance alarm thresholds are set based on the measured performance values of the tested battery system components over a defined battery settling time period of a battery monitoring system of FIG. 2.

In this regard, FIG. 4 illustrates a generalized exemplary process for automatically determining alarm threshold settings for monitored battery system components based on measuring performance values before and after a defined battery settling time period. Performance measurements are made both before and after the expiration of a defined battery settling time period. Before expiration of the defined battery settling time period, the battery monitoring control unit 12 is configured to set an initial performance alarm threshold value (block 44) based on the initially measured performance values 40 of each of the battery system components 15 to be tested. During the test the battery monitoring device 14 will measure the initial performance values for each of the battery system components 15. The battery monitoring control unit 12 sets an initial performance alarm threshold setting for the battery system components 15 based on the initially measured performance values 40. The initial performance alarm threshold setting may be a defined value as determined by the system or operator. After waiting a period interval (e.g. 1 day) the battery monitoring control unit 12 continues by making a subsequent test (block 46) of the battery system components 15 and storing the subsequent measured performance value 42 in memory 33. The battery monitoring control unit 12 will determine if the defined battery settling time period is complete (block 48). If not, the battery monitoring control unit 12 will continue to measure subsequent measured performance values 42 (block 46). If the defined battery settling time period has completed the battery monitoring control unit 12 sets a settled performance alarm threshold value (block 50) based on the subsequent measured performance values 42. The setting of the initial performance alarm threshold values (block 44) and the setting of the settled performance alarm threshold values (block 50) in the preceding steps will be the boundaries by which a performance alarm will be generated. As discussed above the performance values and performance alarms may be based on ohmic, voltage, and/or current measurements, as non-limiting examples.

Figure 5A:
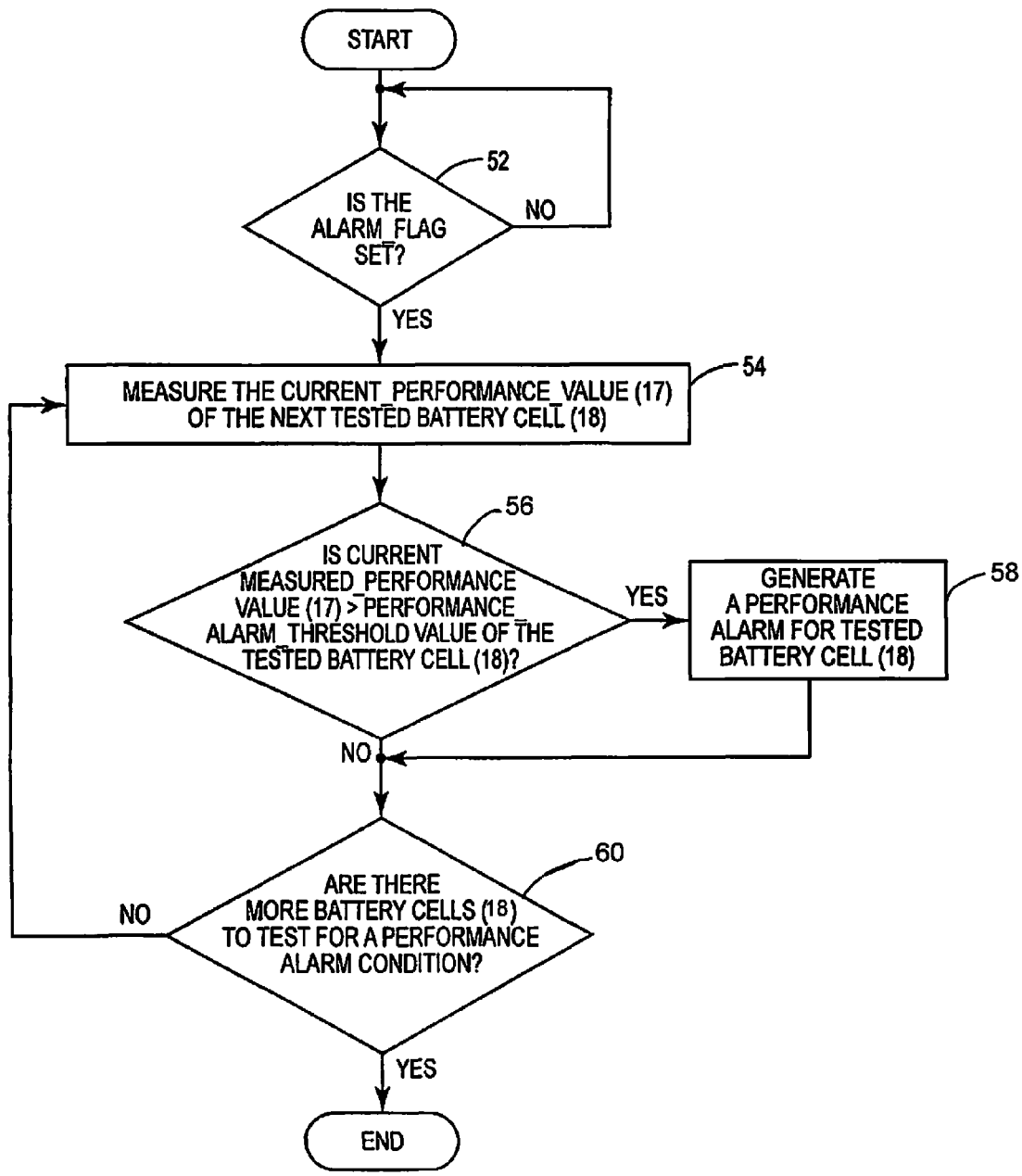
FIG. 5A is a flowchart illustrating an exemplary process for the generation of a performance alarm threshold condition based on measured performance values of the battery system components exceeding the corresponding performance alarm thresholds of the tested battery system components of the battery monitoring system of FIG. 2.

In this regard, FIG. 5A is an exemplary process of generating a performance alarm based on the current measured performance values of battery system components. The exemplary process illustrates the non-limiting example of generating a performance alarm using a battery cell 18. However, it should be understood that this process may be applied to any battery system component 15, as described above. The battery monitoring control unit 12 will test an alarm_flag (block 52) to determine whether an alarm threshold is set. The alarm_flag is discussed below in FIG. 7. The battery monitoring control unit 12 is configured to set the alarm_flag equal to true if there is either a valid initial performance alarm threshold or a settled performance alarm threshold set. Before the defined battery settling time period expires the battery monitoring control unit 12 will use the initial performance alarm threshold setting for the alarm generation. After the defined battery settling time period expires the battery monitoring control unit 12 will use the subsequent performance alarm threshold setting for the alarm generation. In either case the battery monitoring control unit 12 will set the alarm_flag equal to true. If the alarm_flag is true the battery monitoring control unit 12 will test each of the plurality of battery cells 18 measuring a current performance value (current_performance_value) of a next tested battery cell (block 54).

After measuring the current performance value (current_performance_value) of the next tested battery cell (block 54), the battery monitoring control unit 12 will compare the current measured performance value with a performance alarm threshold (block 56) for each of the tested battery cells 18. If the measured current performance value (current_performance_value) exceeds the performance alarm threshold, the exemplary process will generate a performance alarm (block 58) for the test battery cell 18. The battery monitoring control unit 12 may also record the generated performance alarm in memory 33 for reference and logging purposes. Whether a performance alarm was generated or a performance alarm was not generated, the exemplary process will next determine if there are more battery cells to test for a performance alarm condition (block 60). If there are more battery cells to test, the exemplary process will repeat measuring the current performance value (current_performance_value) of the next tested battery cell (block 54). The generated performance alarms will cause the battery monitoring control unit 12 to notify the system operator or record the performance alarm in memory 33.

Figure 5B:
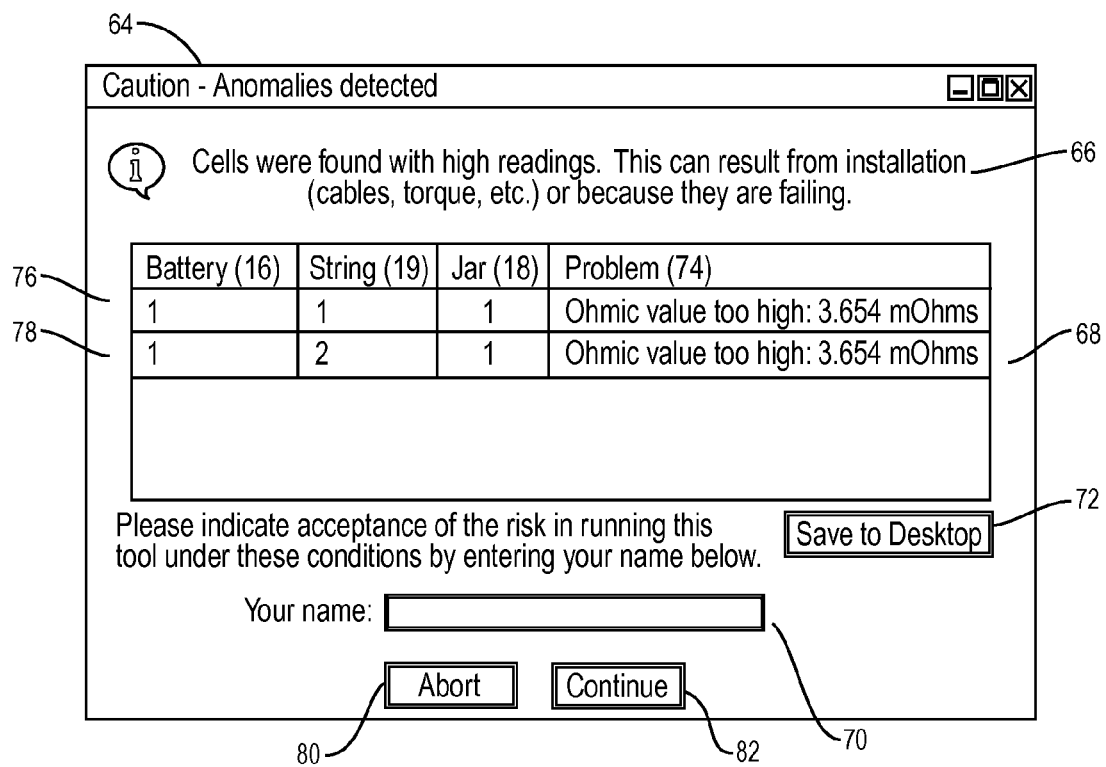
FIG. 5B is an exemplary user interface illustrating the notification of the system operator of a performance alarm threshold condition(s) of the battery monitoring system of FIG. 2.

In this regard, FIG. 5B illustrates a generated performance alarm that may be represented by an anomalies notification window 64. The anomalies notification window 64 may have a generalized message 66, an alarm notification list 68, an operator name dialog box 70 and a "Save to Desktop" button 72. The generalized message 66 indicates the purpose of the anomalies notification window 64 and may comprise a relevant message to the type of performance alarm. The alarm notification list 68 may comprise information indicating where the alarm condition is occurring. For example, the alarm notification list 68 may indicate the battery 16(1), the string or battery cell subset 19, the jar or battery cell 18 and a brief description of the alarm 74. A first alarm 76 on the alarm notification list 68 indicates that a problem with battery 16(1) one (1), battery cell subset (19) one (1), battery cell 18 one (1) has been detected. A second alarm 78 on the alarm notification list 68 indicates that a problem with battery 16(1) one (1), battery cell subset (19) two (2), battery cell 18 one (1) has been detected. The anomalies notification window 64 may also comprise an abort button 80 and a continue button 82. The abort button 80 may allow the operator to discontinue the current operation and return the operator to a home screen or the previous operation. The continue button 82 may allow the operator to continue with the current operation, acknowledging the alarms and continuing to the next step.

Figure 6A:
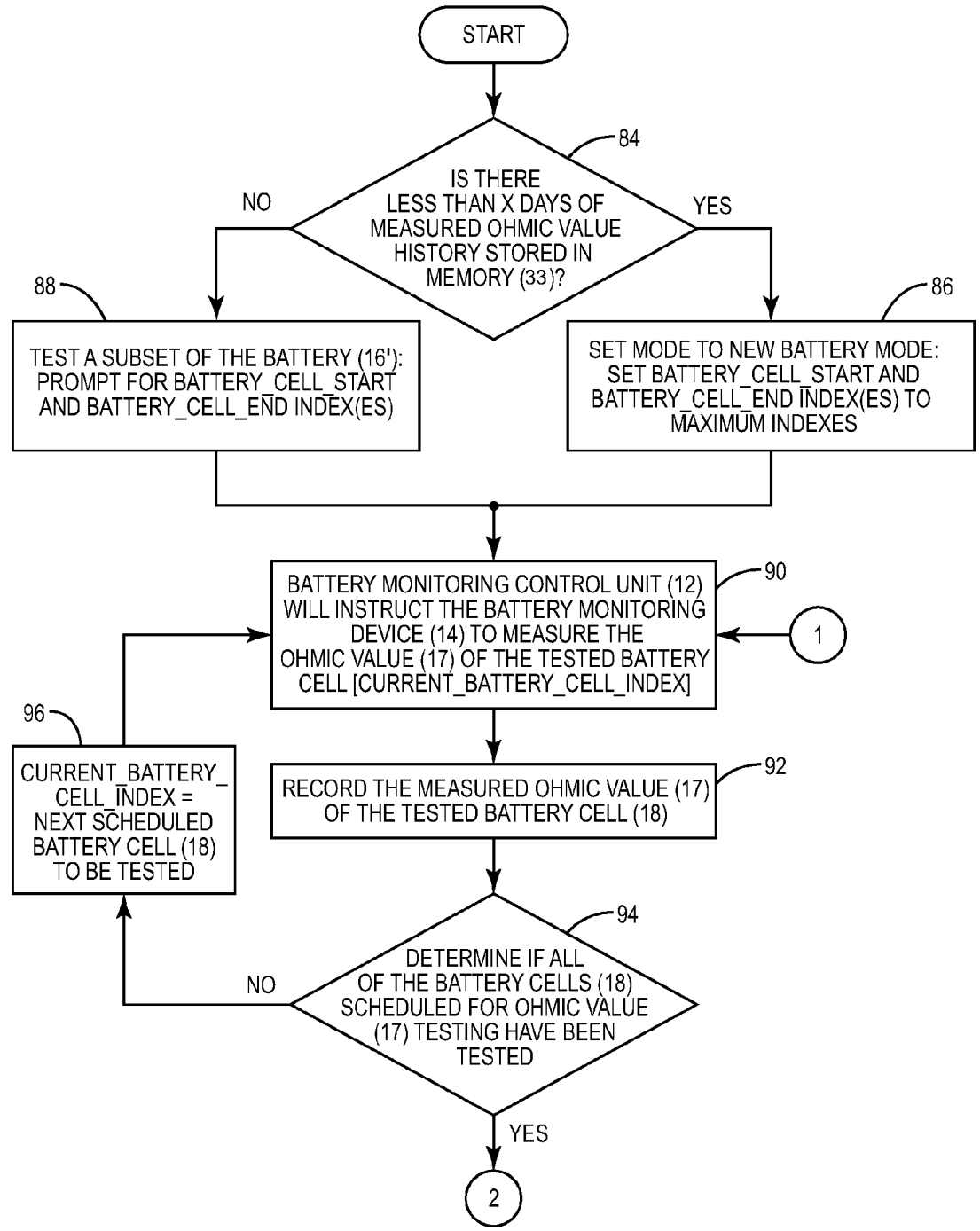
FIG. 6A is a flowchart illustrating an exemplary detailed performance (e.g. ohmic) alarm threshold setup process, wherein measured performance (e.g. ohmic) values of tested battery cells are recorded and alarm threshold values are set based on the measured performance (e.g. ohmic) values of the tested battery system components of the battery monitoring system of FIG. 2.
Figure 6B:
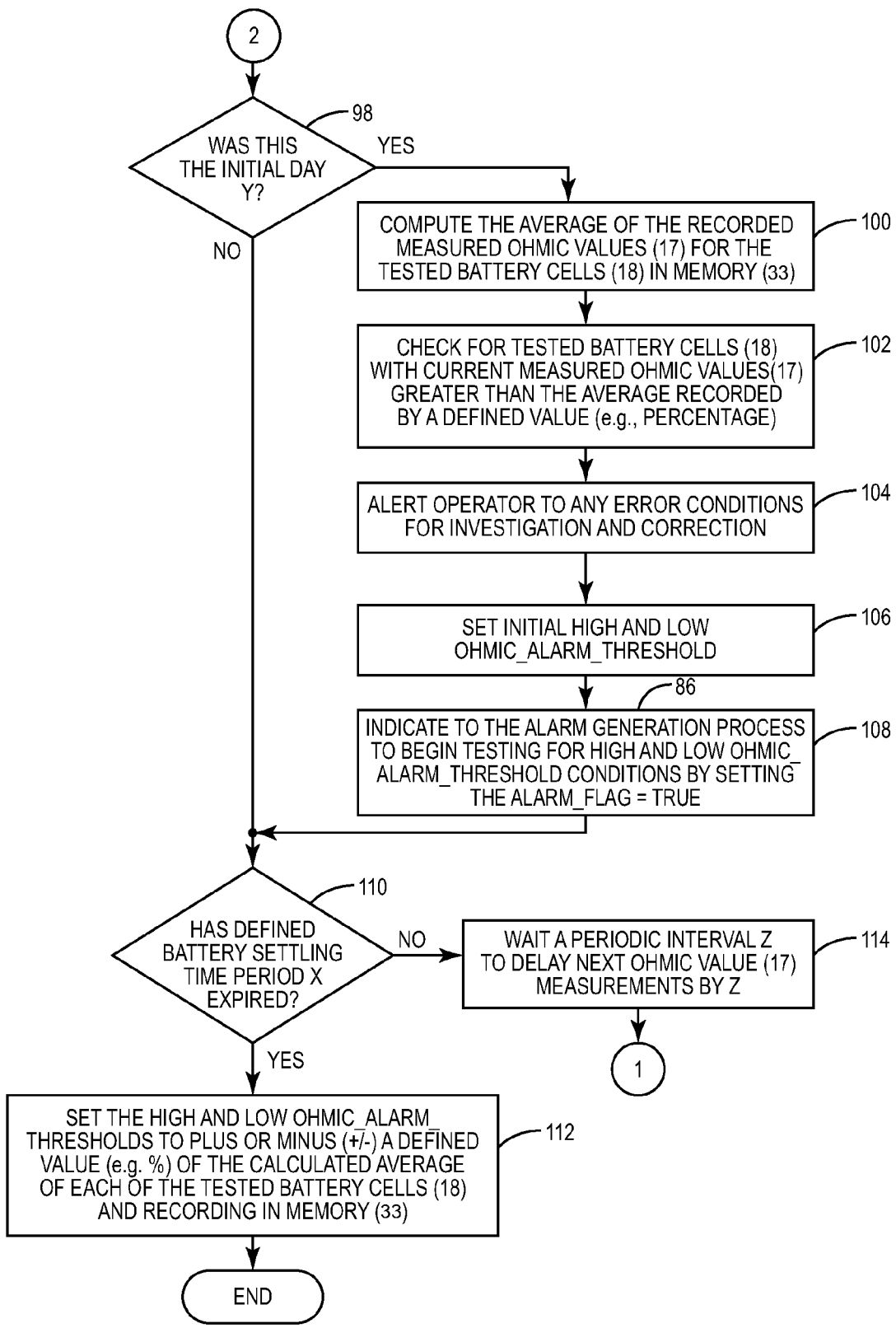
FIG. 6B is a flowchart further illustrating an exemplary detailed performance (e.g. ohmic) alarm threshold setup process, wherein measured performance (e.g. ohmic) values of tested battery cells are recorded and alarm threshold values are set based on the measured performance (e.g. ohmic) values of the tested battery cells of the battery monitoring system of FIG. 2.

Generating performance alarms are the result of current performance values exceeding performance alarm thresholds described and set in the generalized exemplary process in FIG. 4. In this regard, FIGS. 6A and 6B is a more detailed description of the exemplary process of setting performance alarm thresholds, where the performance value is an ohmic value of the tested battery cells 18, a battery cell 18 is a non-limiting exemplary battery system component. The battery monitoring control unit 12 is configured to determine ohmic values during a defined settling time period. If the defined settling time period X has expired, indicating the battery cells 18(1)-18(64) have settled, this exemplary process may not be performed on the entire plurality of battery cells 18(1)-18(64). Instead, the battery monitoring control unit 12 may perform the exemplary process on a substring of the plurality of battery cells 18(1)-18(64), referred to as battery substrings. A substring of the plurality of battery cells 18(1)-18(64) may be tested, instead of the entire plurality of battery cells 18(1)-18(64), because there are enough ohmic values recorded in memory 33 indicating the battery cells 18(1)-18(64) have settled. In the alternative, it is possible to detect the condition of the battery cells 18(1)-18(64) having settled by determining whether a settled performance alarm threshold setting is stored in memory 33. The reason for preventing the performance of the exemplary process again is because this would reset the existing performance alarm threshold settings using current battery cell 18 performance values. It is the existing performance alarm threshold settings that will allow for the battery monitoring control unit 12 to properly determine whether a battery cell 18 is failing or under-performing. Thus, performing the exemplary process again would invalidate the original performance alarm settings and would produce inaccurate results. In this manner, the battery monitoring control unit 12 will determine if there is less than a defined number of days X (e.g. thirty (30) days) of measured ohmic value history stored in memory 33 (block 84).

If there is less than the defined number of days X of measured ohmic value history stored in memory 33, the battery cells 18(1)-18(64) have not settled. Thus, the battery monitoring control unit 12 will test an entire battery (block 86) comprising the entire plurality of battery cells 18. The battery monitoring control unit 12 will set the battery cell start index (battery_cell_start) and the battery cell end index(es) (battery_cell_end) to the maximum indexes of the battery 16(1). If, however, there are more than X days of measured ohmic value history stored in memory 33 the battery monitoring control unit 12 may test a substring of battery cells 18 in a battery (block 88). The substring of battery cells 18 to test is determined by setting the battery cell start index (battery_cell_start) to the starting battery cell 18 and the battery cell end index (battery_cell_end) to the ending battery cell 18.

The battery monitoring control unit 12 may be configured to prompt the operator for the battery cell 18 to start testing and to prompt the operator for the battery cell 18 to end testing.

With continuing reference to FIG. 6A, following the setting of the battery cell start index (battery_cell_start) and the battery cell end index (battery_cell_end) as described above, the battery monitoring control unit 12 will next test the defined range of the plurality of battery cells 18. The battery monitoring control unit 12 will instruct (block 90) the battery monitoring device 14 to measure the ohmic value of the tested battery cell 18 based on the current battery cell index (current_battery_cell_index). A current battery cell index (current_battery_cell_index) is initially set to the battery cell start index (battery_cell_start) index. After the battery cell 18 with the current battery cell index (current_battery_cell_index) is tested and the measured ohmic value is measured, the battery monitoring control unit 12 will record (block 92) the measured ohmic value of the tested battery cell 18 in memory 33. The battery monitoring control unit 12 will then determine (block 94) if all of the battery cells 18 scheduled for ohmic value testing have been tested. If there are still battery cells that are scheduled to be tested, the battery monitoring control unit 12 will increment (block 96) the current battery cell index (current_battery_cell_index) to the next scheduled battery cell 18 to be tested. After the current battery cell index (current_battery_cell_index) has been incremented (block 96) to the next scheduled battery cell 18 to be tested the battery monitoring control unit 12 will return to process step 90. The battery monitoring control unit 12 may repeat this until all of the scheduled battery cells 18 have been tested. At this point the battery monitoring control unit 12 has tested all of the scheduled battery cells. However, prior to setting ohmic alarm thresholds the battery monitoring control unit 12 may initially check for any battery cells with error conditions, such as (but not limited to), incorrect installation, loose connections, faulty inter-tier connections, etc.

In this regard, FIG. 6B illustrates the continuation of the exemplary process of setting ohmic threshold alarms. The battery monitoring control unit 12 determines if this was an initial day (block 98) for testing the scheduled battery cells of the plurality of battery cells 18. The battery monitoring control unit 12 will compute an initial average of the recorded measured ohmic values (block 100) for the tested battery cells and record the average in memory 33. The battery monitoring control unit 12 will next check (block 102) for tested battery cells 18 with current measured ohmic values greater than the average recorded by a defined threshold value (e.g. percentage). The defined threshold value may be determined by a system default or determined by the operator as will be discussed in FIG. 6C below. If any current measured ohmic value is greater, by the defined threshold value, than the average recorded ohmic value, the battery monitoring control unit 12 will alert the operator of a possible error condition (block 104) as discussed above and record in memory 33. During this initial period of the defined settling time period X, the battery monitoring control unit 12 will set an initial high ohmic alarm threshold (high_ohmic_alarm_threshold) and set an initial low ohmic alarm threshold (low_ohmic_alarm_threshold) (block 106). Once the high ohmic alarm threshold (high_ohmic_alarm_threshold) and the low ohmic alarm threshold (low_ohmic_alarm_threshold) settings are set, the battery monitoring control unit 12 may begin (block 108) the alarm generation process of FIG. 5A to begin execution. The battery monitoring control unit 12 may next determine if the defined battery settling time period has expired (block 110) indicating that the batteries have settled. However, if the current test iteration (e.g. Day Y) (block 98) is not the initial day then the battery monitoring control unit 12 may skip the process of setting the initial ohmic alarm thresholds and proceed directly to determining if the defined battery settling time period has expired (block 110).

With continuing reference to FIG. 6B, if the defined battery settling time period has expired (block 110) the battery monitoring control unit 12 will set the high ohmic alarm threshold (high_ohmic_alarm_threshold) to a defined threshold value above the calculated average of each of the tested batteries (block 112). The battery monitoring control unit 12 will also set the low ohmic alarm threshold (low_ohmic_alarm_threshold) to a defined threshold value below the calculated average of each of the tested batteries (block 112). The high ohmic alarm threshold (high_ohmic_alarm_threshold) and the low ohmic alarm threshold (low_ohmic_alarm_threshold) will be recorded in memory 33.

If, however, the defined battery settling time period has not expired (block 110), the exemplary ohmic alarm setup process of FIGS. 6A and 6B will delay (block 114) the next ohmic value measurements by a defined periodic interval Z (e.g. 1 hour, 1 day, etc). The defined periodic interval Z is a period of delay defined by the system with a default or in the alternative a technician may enter the value for the proper period of waiting. The exemplary process will wait this defined periodic interval Z before performing the next incremental performance measurement. The defined periodic interval Z allows for continued settling of the battery cell 18(1)-18(64). As an example, the defined periodic interval Z may be 1 hour, 1 day or other. After the exemplary ohmic alarm setup process delays by the periodic interval Z the next ohmic value measurements are made. The process will proceed with the battery monitoring control unit 12 instructing 90 the battery monitoring device 14 to measure the next ohmic values of the scheduled battery cells. The exemplary alarm setup process will proceed until the defined battery settling time period has expired (block 110). In alternative embodiments the exemplary alarm setup process may set the ohmic alarm thresholds using defined threshold values in absolute terms (e.g. 0.73 ohms, 1 ohm, etc) or using other forms of computation, such as percentages, etc. stored in memory 33. The defined threshold values may be set by system default or defined by operator entry.

Figure 6C:
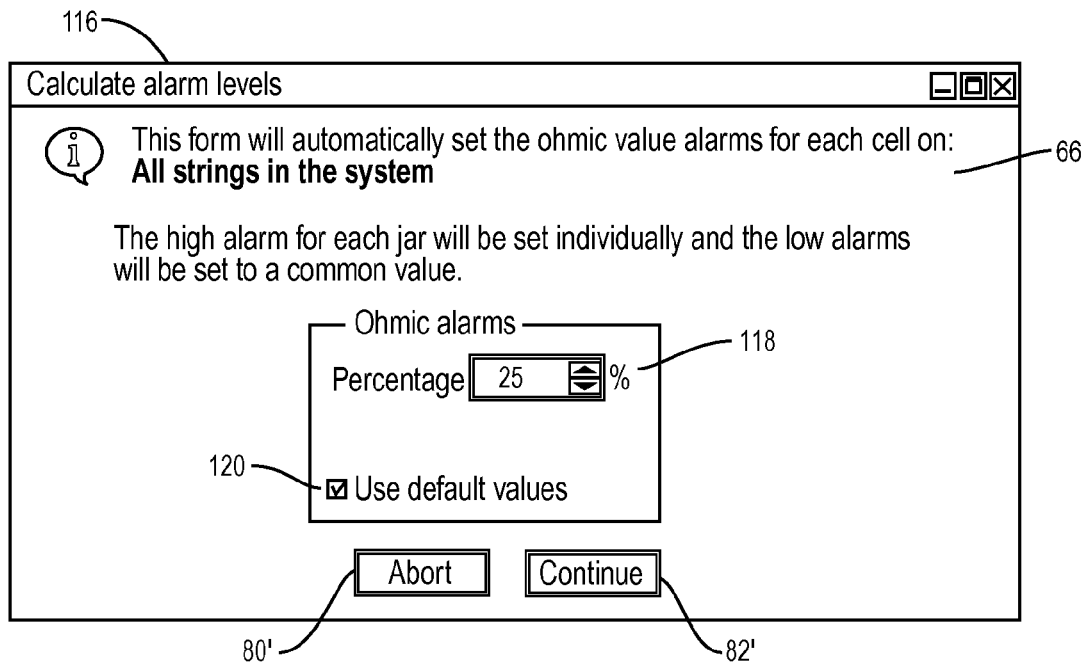
FIG. 6C is an exemplary user interface illustrating the prompting of the system operator for a percentage value used to calculate the performance alarm thresholds of the battery monitoring system of FIG. 2.

In this manner, FIG. 6C illustrates a non-limiting exemplary defined threshold value user interface 116 that the battery monitoring control unit 12 may use to prompt the system operator for a defined threshold value (e.g. percentage) 118. The defined threshold value 118 may be set by the system operator or optionally may be suggested and set by a system default 120. The defined threshold value user interface 116 may comprise a generalized message indicating what the dialog is prompting. For example, if the operation mode is for testing the entire battery (block 86), the dialog will indicate that the defined threshold value is for setting all strings in the system. The defined threshold value user interface 116 may comprise an abort button 80' and a continue button 82'. The abort button 80' may allow the operator to discontinue the current operation and return the operator to a home screen or the previous operation. The continue button 82' may allow the operator to continue with the current operation, acknowledging the alarms and continuing to the next step. The defined threshold value 118 as well as the other system parameters will be stored in memory 33.

Figure 7:
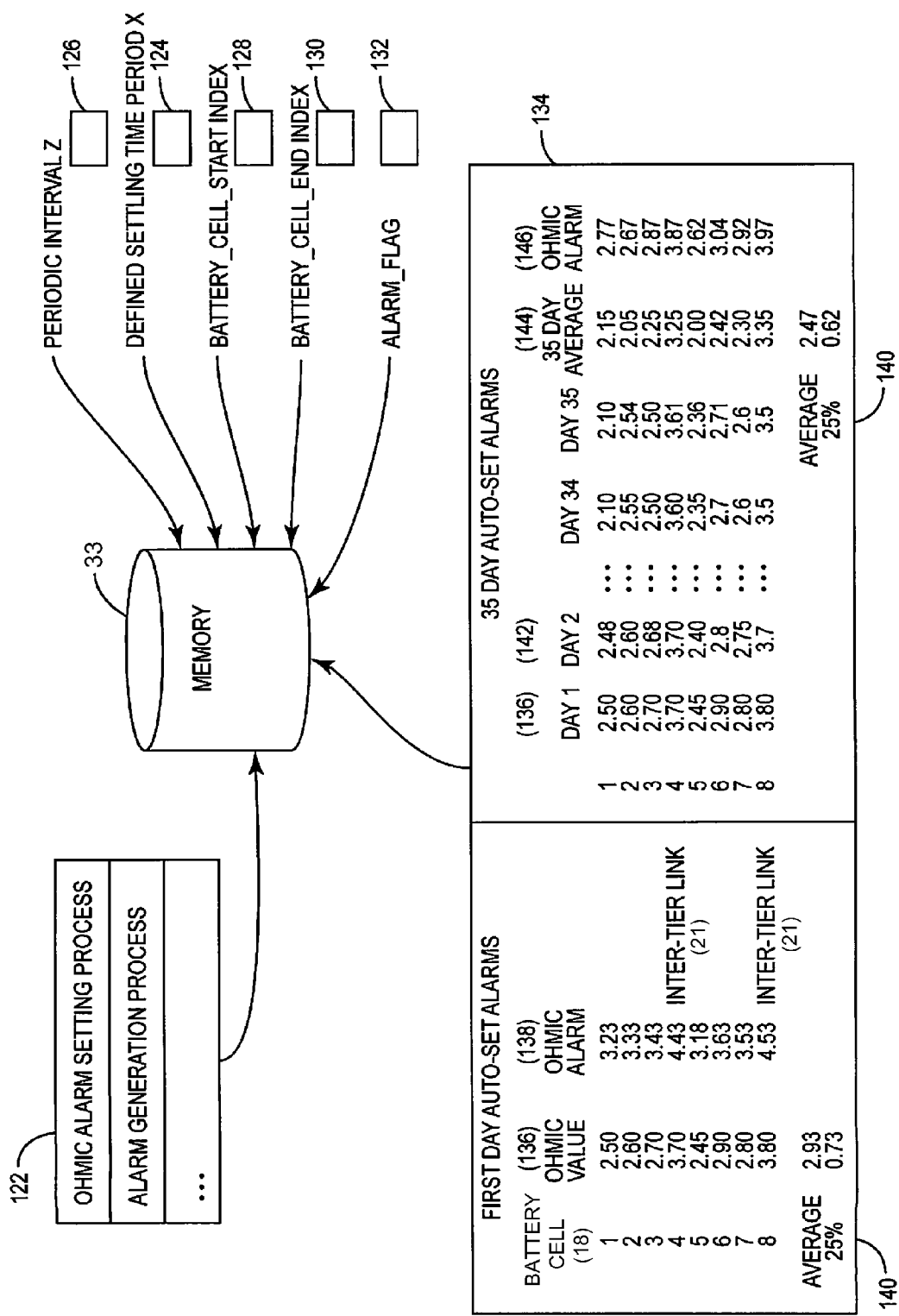
FIG. 7 is an exemplary diagram of the processes and data structures that can be used by the battery monitoring system for setting the performance (e.g. ohmic) alarm thresholds and generating a performance (e.g. ohmic) alarm signaling a performance (e.g. ohmic) alarm threshold condition of the tested battery system components of a battery monitoring system of FIG. 2.

In this regard, FIG. 7 illustrates the processes, tables and settings stored in memory 33. The exemplary processes for the performance (e.g. ohmic) alarm setting process and an alarm generation process 122 may be stored in memory 33. The memory 33 will also store the system parameters, as discussed above, a defined settling time period X 124, a periodic interval Z 126, a battery_cell_start index 128 and a battery_cell_end index 130. The alarm_flag 132 used to indicate that valid ohmic alarm thresholds have been set is also stored in memory 33. An ohmic value table 134 is comprised of initial measured ohmic values 136, and an initial average of the recorded measured ohmic values 138. The ohmic value table 134 is also comprised of a defined threshold value 140, a subsequent measured ohmic values 142 and an average of each of the tested batteries 144. The battery monitoring control unit 12 will also compute and store in memory 33 the subsequent ohmic alarm thresholds 146 based on the defined threshold value 140.

Figure 8:
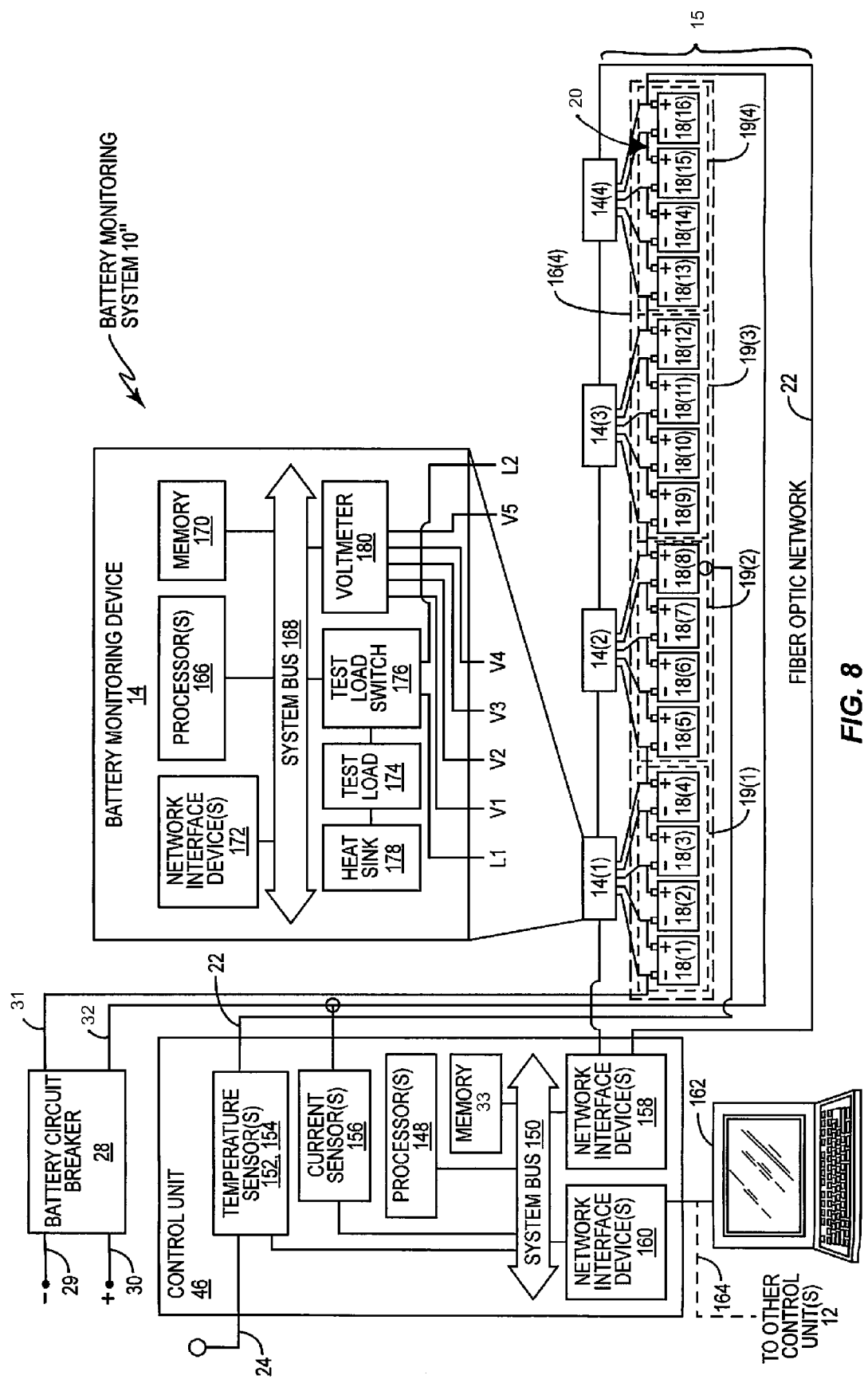
FIG. 8 is a block diagram of an exemplary processor-based system that includes battery monitoring devices and/or battery monitoring control unit(s) for testing performance (e.g. ohmic) values of battery system components of a backup power supply.

According to embodiments disclosed herein, the automatically determining of alarm threshold settings for monitored battery system components in battery 16, 16(1), and 16(2) based on the testing of ohmic values 17, may be provided in or integrated into any processor-based device. In this regard, FIG. 8 illustrates an example of a processor-based battery monitoring system 10(1)' that can employ the methods of FIG. 3 through FIG. 6B, and the battery monitoring control unit 12 and/or the battery monitoring device(s) 14 of FIG. 2. In this example, the battery monitoring system 10(2) comprises at least one battery monitoring control unit 12 and a plurality of battery monitoring devices 14 (as a non-limiting example, battery monitoring devices 14(1)-14(4)). The battery monitoring system 10(2) may also comprise a battery circuit breaker (BCB) 28 for guarding the battery 16(2) from overcurrents. In this example, the battery monitoring control unit 12 includes one or more processor(s) 148. The processor(s) 148 is coupled to a system bus 150. As is well known, the battery monitoring control unit 12 communicates with other system devices on the system bus 150 by exchanging address, control, and data information over the system bus 150. For example, the processor(s) 148 can communicate memory access requests to a memory 33 across the system bus 150. Although not illustrated in FIG. 8, multiple system buses 150 may be provided wherein each system bus 150 constitutes a different fabric.

Other devices can be connected to the system bus 150. As illustrated in FIG. 8, at least one battery cell temperature sensor 152 may be coupled to the system bus 150 for receiving battery temperature measurements of one or more battery cells 18 of the battery 16(2). An ambient temperature sensor 154 may also be coupled to the system bus 150. At least one current sensor 156 for measuring the currents of the battery 16(2) may also be coupled to the system bus 150.

At least one network interface device(s) 158 may be coupled to the fiber optic network 22 to allow the battery monitoring control unit 12 to communicate with the battery monitoring devices 14. Because the fiber optic network 22 is a fiber optic network, and not an electricity-conducting network, currents of the battery 16(2) flowing through the fiber optic network 22 are avoided.

The battery monitoring control unit 12 may also comprise network interface device(s) 160 for communicating with a client computer 162 for accessing the battery monitoring control unit 12. The client computer 162 and/or battery monitoring control unit 12 may alert the user to an impending failure or failure of a battery cell 18. The network interface device(s) 160 may be attached to a network 164. In one embodiment, the network 164 may be an RS-485 network, as a non-limiting example. Alternatively, the network 164 may be an Internet Protocol (IP) network or other network allowing other client computers 162 to access the battery monitoring control unit 12. The network 164 may also allow the client computer 162 to access other battery monitoring control units 12. The network interface device(s) 160 can be any device(s) configured to allow exchange of data to and from the network 164. The network 164 can be any type of network, including but not limited to, a wired or wireless network, a private or public network, a local area network (LAN), a wide area network (WLAN), and the Internet. The network interface device(s) 158, 160 can be configured to support any type of communication protocol desired. The client computer 162 may be a desktop computer, a laptop computer, a tablet, or other client device.

The fiber optic network 22 may alternatively be provided as any type of network (e.g. wired or wireless) allowing the network interface device(s) wired or wireless 158, 160 (e.g. wired or wireless) of the battery monitoring control unit 12 to communicate with the battery monitoring device(s) 14 (as non-limiting examples, battery monitoring devices 14(1)-14(4)). Portions of the network may be electricity conducting. However, the network may comprise electrically isolating components so that electricity stored in the battery cells 18 (as non-limiting examples, 18(1)-18(16)) is prevented from being conducted through the network connecting the battery monitoring device(s) 14 (as non-limiting examples, 14(1)-14(4)) and the network interface device(s) 158, 160 of the battery monitoring control unit 12.

As also illustrated in FIG. 8, the battery monitoring device 14 comprises processor(s) 166 coupled to a system bus 168. As is well known, the processor(s) 166 also communicate with other devices on the system bus 168 by exchanging address, control, and data information over the system bus 168. For example, the processor(s) 166 can communicate memory access requests to a memory 170. The battery monitoring device 14 also comprises network interface device(s) 172 configured to be coupled to the fiber optic network 22, as a non-limiting example. The battery monitoring device 14 also comprises a resistive test load 174 used for inducing a current in the battery cell subset 19(1) of battery cells 18(1)-18(4) to which the battery monitoring device 14 is coupled. The resistive test load 174 is coupled to each end of a battery cell subset 19 of the battery cells 18 connected in series. The battery monitoring device 14 also comprises a test load switch 176 for coupling the resistive test load 174 to current leads L1, L2 for inducing a current in the battery cell subset 19 of the battery cells 18 in series. The test load switch 176 may be any kind of switch, including a relay, a transistor, a field effect transistor (FET), or any other type of switch for coupling the resistive test load 174 to the battery cell subset 19 of the battery cells 18.

The battery monitoring device 14 also comprises a heat sink 178 for receiving dissipating heat generated by the resistive test load 174 when the resistive test load 174 is coupled to the battery cell subset 19 of the battery cells 18. The battery monitoring device 14 also comprises a voltmeter 180 having a plurality of voltage leads V1-V5, for measuring the voltages of each battery cell 18(1)-18(4) of the battery cell subset 19 of the battery cells 18, and to which the battery monitoring device 14 is configured to be coupled.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The battery monitoring system control units and battery monitoring devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a processor, a DSP, an Application Specific Integrated Circuit (ASIC), an FPGA or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A battery monitoring control unit configured to determine performance alarm threshold settings for battery system components in a battery system, the battery monitoring control unit configured to:
    before expiration of a defined battery settling time period:
        instruct at least one battery monitoring device coupled to a plurality of battery system components to measure an initial performance value of each battery system component of the plurality of battery system components;
        set an initial performance alarm threshold setting for each tested battery system component of the plurality of battery system components based on the at least one measured performance value of the tested battery system component, the initial performance alarm threshold setting to be used to determine battery performance characteristics of the tested battery system component during an initial battery testing time period; and
        instruct at least one battery monitoring device coupled to the plurality of battery system components to measure at least one subsequent performance value of each battery system component of the plurality of battery system components; and
    upon expiration of the defined battery settling time period, set a settled performance alarm threshold setting for each tested battery system component based on the at least one subsequent measured performance value for each tested battery system component, the settled performance alarm threshold setting to be used to determine battery performance characteristics of each tested battery system component after the battery settling time period.

2. The battery monitoring control unit of claim 1, wherein at least one battery system component among the plurality of battery system components is comprised of at least one battery cell.

3. The battery monitoring control unit of claim 1, wherein at least one battery system component among the plurality of battery system components is comprised of at least one inter-tier link connecting a first battery subset to a second battery subset.

4. The battery monitoring control unit of claim 1, wherein at least one battery system component among the plurality of battery system components is comprised of at least one inter-cell link connecting a first battery cell to a second battery cell.

5. The battery monitoring control unit of claim 1, at least one battery system component among the plurality of battery system components is comprised of first battery supply line and a second battery supply line coupled to the battery system.

6. The battery monitoring control unit of claim 1 further configured to determine:
    if a battery system component among the plurality of battery system components has a settled performance alarm threshold setting stored in memory; and
    instruct the at least one battery monitoring device to measure the initial performance value of the battery system component among the plurality of battery system components, if the battery system component among the plurality of battery system components does not have a settled performance alarm threshold setting stored in memory.

7. The battery monitoring control unit of claim 6 further configured to not instruct the at least one battery monitoring device to measure the initial performance value of the battery system component among the plurality of battery system components, if the battery system component among the plurality of battery system components has the settled performance alarm threshold setting stored in memory.

8. The battery monitoring control unit of claim 1 further configured to, before expiration of the defined battery settling time period:
compare the at least one subsequent measured performance value of each tested battery system component among the plurality of battery system components to each initial performance alarm threshold setting for each tested battery system component; and
generate at least one performance alarm for each tested battery system component among the plurality of battery system components if the at least one subsequent measured performance value exceeds the initial performance alarm threshold setting for the tested battery system component.

9. The battery monitoring control unit of claim 8 further configured to record the at least one generated performance alarm in memory coupled to the battery monitoring control unit.

10. The battery monitoring control unit of claim 8,
wherein the initial performance alarm threshold setting comprises an initial performance alarm threshold setting band for each tested battery system component of the plurality of battery system components; and
wherein the battery monitoring control unit is configured to generate the at least one performance alarm for each tested battery system component among the plurality of battery system components if the at least one subsequent measured performance value is outside the initial performance alarm threshold setting band for the tested battery system component.

11. The battery monitoring control unit of claim 10 further configured to set the initial performance alarm threshold setting band for each tested battery system component of the plurality of battery system components as comprising:
an initial high performance alarm threshold setting a defined value above the measured initial performance value of each battery system component; and
an initial low performance alarm threshold setting a defined value below the measured initial performance value of each battery system component.

12. The battery monitoring control unit of claim 11 configured to:
set the initial high performance alarm threshold setting a defined percentage above the measured initial performance value of each battery system component; and
set the initial low performance alarm threshold setting the defined percentage below the measured initial performance value of each battery system component.

13. The battery monitoring control unit of claim 1 further configured to, after expiration of the defined battery settling time period, instruct the at least one battery monitoring device coupled to the plurality of battery system components to periodically measure a settled performance value of each battery system component of the plurality of battery system components.

14. The battery monitoring control unit of claim 13 further configured to, after expiration of the defined battery settling time period:
compare the measured settled performance value of each tested battery system component among the plurality of battery system components to each settled performance alarm threshold setting for each tested battery system component; and
generate a settled performance alarm for each tested battery system component among the plurality of battery system components if the measured settled performance value exceeds the settled performance alarm threshold setting for the tested battery system component.

15. The battery monitoring control unit of claim 14 further configured to record the generated settled performance alarm in memory coupled to the battery monitoring control unit.

16. The battery monitoring control unit of claim 15,
wherein the settled performance alarm threshold setting comprises a settled performance alarm threshold setting band for each tested battery system component of the plurality of battery system components; and
wherein the battery monitoring control unit is configured to generate the settled performance alarm for each tested battery system component among the plurality of battery system components if the measured settled performance value is outside the settled performance alarm threshold setting band for the tested battery system component.

17. The battery monitoring control unit of claim 16 further configured to set the settled performance alarm threshold setting band for each tested battery system component of the plurality of battery system components as comprising:
a settled high performance alarm threshold setting to a defined value above the measured settled performance value of each battery system component; and
a settled low performance alarm threshold setting to a defined value below the measured settled performance value of each battery system component.

18. The battery monitoring control unit of claim 17 configured to:
set the settled high performance alarm threshold setting to a defined percentage above the measured settled performance value of each battery system component; and
set the settled low performance alarm threshold setting to the defined percentage below of the measured settled performance value of each battery system component.

19. The battery monitoring control unit of claim 1 configured to, upon expiration of the defined battery settling time period, set the settled performance alarm threshold setting for each tested battery system component based on an average of the plurality of subsequent performance values for each tested battery system component.

20. The battery monitoring control unit of claim 1, wherein the defined battery settling time period is at least thirty (30) days.

21. The battery monitoring control unit of claim 1 configured to:
before expiration of the defined battery settling time period:
instruct at least one battery monitoring device coupled to the plurality of battery system components to measure the initial performance value of each battery system component of a subset of the plurality of battery system components; and
instruct at least one battery monitoring device coupled to the plurality of battery system components to measure at least one subsequent performance value of each battery system component of the subset of the plurality of battery system components.

22. The battery monitoring control unit of claim 1, wherein the at least one measured performance value of the tested battery system component is an ohmic value of each battery system component of the plurality of battery system components.

23. A method of determining performance alarm threshold settings for a plurality of battery system components monitored by a battery monitoring system, comprising:
before expiration of a defined battery settling time period:
instructing at least one battery monitoring device coupled to the plurality of battery system components to measure an initial performance value of each battery system component of the plurality of battery system components;
setting an initial performance alarm threshold setting for each tested battery system component of the plurality of battery system components based on the at least one measured performance value of the tested battery system component, the initial performance alarm threshold setting to be used to determine battery performance characteristics of the tested battery system component during an initial battery testing time period; and
instructing at least one battery monitoring device coupled to the plurality of battery system components to measure at least one subsequent performance value of each battery system component of the plurality of battery system components; and
upon expiration of the defined battery settling time period, setting a settled performance alarm threshold setting for each tested battery system component based on the at least one subsequent measured performance value for each tested battery system component, the settled performance alarm threshold setting to be used to determine the battery performance characteristics of each tested battery system component after the defined battery settling time period.

24. The method of claim 23 further comprising, before expiration of the defined battery settling time period:
Comparing the at least one subsequent measured performance value of each tested battery system component among the plurality of battery system components to each initial performance alarm threshold setting for each tested battery system component; and
generating at least one performance alarm for each tested battery system component among the plurality of battery system components if the at least one subsequent measured performance value exceeds the initial performance alarm threshold setting for the tested battery system component.

25. The method of claim 24 further comprising recording the at least one generated performance alarm in memory.

26. The method of claim 24,
wherein the initial performance alarm threshold setting comprises an initial performance alarm threshold setting band for each tested battery system component of the plurality of battery system components; and
generating the at least one performance alarm for each tested battery system component among the plurality of battery system components if the at least one subsequent measured performance value is outside the initial performance alarm threshold setting band for the tested battery system component.

27. The method of claim 26 further comprises setting the initial performance alarm threshold setting band for each tested battery system component of the plurality of battery system components, wherein:
an initial high performance alarm threshold setting to a defined value above the measured initial performance value of each battery system component; and
an initial low performance alarm threshold setting to a defined value below the measured initial performance value of each battery system component.

28. The method of claim 27 comprises:
setting the initial high performance alarm threshold setting to a defined percentage above the measured initial performance value of each battery system component; and
setting the initial low performance alarm threshold setting to a defined percentage below the measured initial performance value of each battery system component.

29. The method of claim 23 further comprises, after expiration of the defined battery settling time period, instructing the at least one battery monitoring device coupled to the plurality of battery system components to periodically measure a settled performance value of each battery system component of the plurality of battery system components.

30. The method of claim 29 further comprises, after expiration of the defined battery settling time period:
comparing the measured settled performance value of each tested battery system component among the plurality of battery system components to each settled performance alarm threshold setting for each tested battery system component; and
generating a settled performance alarm for each tested battery system component among the plurality of battery system components if the measured settled performance value exceeds the settled performance alarm threshold setting for the tested battery system component.

31. The method of claim 30 further comprises recording the generated settled performance alarm in memory.

32. The method of claim 31,
wherein the settled performance alarm threshold setting comprises a settled performance alarm threshold setting band for each tested battery system component of the plurality of battery system components; and
generating the settled performance alarm for each tested battery system component among the plurality of battery system components if the measured settled performance value is outside the settled performance alarm threshold setting band for the tested battery system component.

33. The method of claim 32 further comprises setting the settled performance alarm threshold setting band for each tested battery system component of the plurality of battery system components, wherein:
a settled high performance alarm threshold setting to a defined value above the measured settled performance value of each battery system component; and
a settled low performance alarm threshold setting to a defined value below the measured settled performance value of each battery system component.

34. The method of claim 33 comprises:
setting the settled high performance alarm threshold setting to a defined percentage above the measured settled performance value of each battery system component; and
setting the settled low performance alarm threshold setting to a defined percentage below the measured settled performance value of each battery system component.

35. The method of claim 33 comprises, upon expiration of the defined battery settling time period, setting the settled performance alarm threshold setting for each tested battery system component based on an average of the subsequent performance values for each tested battery system component.

36. A battery monitoring system, comprising:
   a plurality of battery cell substrings each comprising a plurality of battery cells electrically connected in series;
   at least one inter-tier link electrically coupling one battery cell substring of the plurality of battery cell substrings to another battery cell substring of the plurality of battery cell substrings to form a battery from the plurality of battery cell substrings;
   a plurality of inter-cell links electrically couple adjacent battery cells of the plurality of battery cells together to form battery cell substrings;
   a plurality of battery monitoring devices, each battery monitoring device of the plurality of battery monitoring devices coupled to a battery cell substring among the plurality of battery cell substrings; and
   a battery monitoring control unit coupled to the plurality of battery monitoring devices; and
   the battery monitoring control unit configured to determine performance alarm threshold settings for battery system components, the battery monitoring control unit configured to:
      before expiration of a defined battery settling time period:
         instruct at least one of the plurality of battery monitoring devices coupled to a plurality of battery system components to measure an initial performance value of each battery system component of the plurality of battery system components;
         set an initial performance alarm threshold setting for each tested battery system component of the plurality of battery system components based on the at least one measured performance value of the tested battery system component, the initial performance alarm threshold setting to be used to determine battery performance characteristics of the tested battery system component during an initial battery testing time period; and
         instruct at least one of the plurality of battery monitoring devices coupled to the plurality of battery system components to measure at least one subsequent performance value of each battery system component of the plurality of battery cells; and
      upon expiration of the defined battery settling time period, set a settled performance alarm threshold setting for each tested battery system component based on the at least one subsequent measured performance value for each tested battery system component, the settled performance alarm threshold setting to be used to determine battery performance characteristics of each tested battery system component after the defined battery settling time period.

37. The battery monitoring system of claim 36 further configured to, before expiration of the defined battery settling time period:
   compare the at least one subsequent measured performance value of each tested battery system component among the plurality of battery system components to each initial performance alarm threshold setting for each tested battery system component; and
   generate at least one performance alarm for each tested battery system component among the plurality of battery system components if the at least one subsequent measured performance value exceeds the initial performance alarm threshold setting for the tested battery system component.

38. The battery monitoring system of claim 37,
   wherein the initial performance alarm threshold setting comprises an initial performance alarm threshold setting band for each tested battery system component of the plurality of battery system components; and
   wherein the battery monitoring control unit is configured to generate the at least one performance alarm for each tested battery system component among the plurality of battery system components if the at least one subsequent measured performance value is outside the initial performance alarm threshold setting band for the tested battery system component.

39. The battery monitoring system of claim 38 further configured to set the initial performance alarm threshold setting band for each tested battery system component of the plurality of battery system components as comprising:
   an initial high performance alarm threshold setting to a defined value above the measured initial performance value of each battery system component; and
   an initial low performance alarm threshold setting to a defined value below the measured initial performance value of each battery system component.

40. The battery monitoring system of claim 36 further configured to, after expiration of the defined battery settling time period, instruct the at least one of the plurality of battery monitoring devices coupled to the plurality of battery system components to periodically measure a settled performance value of each battery system component of the plurality of battery system components.

41. The battery monitoring system of claim 40 further configured to, after expiration of the defined battery settling time period:
   compare the measured settled performance value of each tested battery system component among the plurality of battery system components to each settled performance alarm threshold setting for each tested battery system component; and
   generate a settled performance alarm for each tested battery system component among the plurality of battery system components if the measured settled performance value exceeds the settled performance alarm threshold setting for the tested battery system component.

42. The battery monitoring system of claim 41,
   wherein the settled performance alarm threshold setting comprises a settled performance alarm threshold setting band for each tested battery system component of the plurality of battery system components; and
   wherein the battery monitoring control unit is configured to generate the settled performance alarm for each tested battery system component among the plurality of battery system components if the measured settled performance value is outside the settled performance alarm threshold setting band for the tested battery system component.

43. The battery monitoring system of claim 42 further configured to set the settled performance alarm threshold setting band for each tested battery system component of the plurality of battery system components as comprising:
   a settled high performance alarm threshold setting to a defined value above the measured settled performance value of each battery system component; and
   a settled low performance alarm threshold setting to a defined value below the measured settled performance value of each battery system component.

44. The battery monitoring system of claim 36 configured to, upon expiration of the defined battery settling time period, set the settled performance alarm threshold setting for each tested battery system component based on an average of the subsequent performance values for each tested battery system component.

45. The battery monitoring system of claim 36 configured to:
before expiration of the defined battery settling time period:
instruct at least one of the plurality of battery monitoring devices coupled to the plurality of battery system components to measure the initial performance value of each battery system component of a subset of the plurality of battery system components; and
instruct at least one of the plurality of battery monitoring devices coupled to the plurality of battery system components to measure at least one subsequent performance value of each battery system component of the subset of the plurality of battery system components.

* * * * *